United States Patent [19]

Mort et al.

[11] Patent Number: 5,099,296
[45] Date of Patent: Mar. 24, 1992

[54] THIN FILM TRANSISTOR

[75] Inventors: Joseph Mort; Frank Jansen; Mary A. Machonkin, all of Webster; Koji Okumura, Rochester, all of N.Y.

[73] Assignee: Xerox Corporation, Stamford, Conn.

[21] Appl. No.: 505,754

[22] Filed: Apr. 6, 1990

[51] Int. Cl.$^5$ .................. H01L 27/12; H01L 45/00; H01L 27.01; H01L 29/00
[52] U.S. Cl. .......................... 357/22; 357/4; 357/23.1; 357/23.7; 357/59; 357/16
[58] Field of Search ............... 357/42, 16, 23.7, 22, 357/2, 23.1, 49, 16, 4, 61, 59; 427/166

[56] References Cited

U.S. PATENT DOCUMENTS

| | | | |
|---|---|---|---|
| 4,265,990 | 5/1981 | Stolka et al. | 430/59 |
| 4,546,009 | 10/1985 | Tiedge et al. | 357/30 |
| 4,571,447 | 2/1986 | Prins | 136/252 |
| 4,740,263 | 4/1988 | Imai et al. | 427/42 |
| 4,849,797 | 7/1989 | Ukai et al. | 357/23.7 |
| 4,925,701 | 5/1990 | Jansen et al. | 427/166 |

FOREIGN PATENT DOCUMENTS

| | | | |
|---|---|---|---|
| 58141572 | 2/1982 | Japan | 29/7 B |
| 59213126 | 4/1985 | Japan | 21/205 |
| 60246627 | 4/1986 | Japan | 21/265 |

OTHER PUBLICATIONS

Article in IEEE Electron Device Letters, vol. ED-8, No. 8, Aug. 87 by M. W. Geiss et al. titled "High-Temperature ... Diamond".
Article in Japanese Journal of Applied Physics, vol. 28, No. 12, Dec. 89 by H. Shiomi et al., titled "Field-Effect Transistors ... Film".
Article in Japanese Journal of Applied Physics, vol. 25, No. 10, L808, Oct. 86 by A. Ono et al. titled "Thermal Conductivity of Diamond ... CVD".

Primary Examiner—Andrew J. James
Assistant Examiner—Carl Whitehead, Jr.
Attorney, Agent, or Firm—Duane C. Basch

[57] ABSTRACT

A thin film transistor in which a source electrode is electrically isolated from a drain electrode and a gate electrode. The gate electrode is formed on one surface of an electrically insulating layer. A semiconducting layer is formed on the other surface of the electrically insulating layer. The semiconducting layer has a charge carrier mobility of at least 1 cm$^2$/V-sec. and is made from a polycrystalline diamond layer. The source electrode and the drain electrode are formed on one surface of the polycrystalline diamond layer. The other surface of the polycrystalline diamond layer is in integral contact with the other surface of the electrically insulating layer.

11 Claims, 5 Drawing Sheets

THIN FILM TRANSISTOR

This invention relates generally to thin film transistors, and more particularly concerns a large area thin film transistor using a polycrystalline diamond film as the active semiconductive layer of the transistor.

In a typical thin film transistor, a hydrogenated amorphous silicon is used as the active semiconducting layer. Since the amorphous silicon is photoconductive, incident light must be shielded from the active layer of the thin film transistor to avoid any impact to the on-off ratio of the transistor. A light shielding layer is used to isolate the active layer from incident light. The necessity of a light shielding layer results in additional manufacturing steps, as well as, larger more complex structures for the transistors. Furthermore, since amorphous silicon is used for the active layer, the electric field mobility is low, thereby reducing the current driving power of the transistor. Diamond films naturally exhibit insulating properties and will exhibit semiconductive properties when doped with suitable impurities. For example, Japanese Patent Publication No. 58-141572, published Feb. 18, 1982, discloses a diamond thin-film semiconductor device in which a diamond thin-film is formed on a substrate. A diamond thin-film is also used as the gate insulating film of the semiconductor device. In addition, Japanese Patent Publication No. 59-213126, published Apr. 10, 1985, describes a diamond semiconductor element wherein an N-type diamond layer is epitaxially grown on a substrate and an insulating film is then vacuum deposited in vapor phase. A circuit consisting of a P-N junction is formed on the N-type epitaxial diamond film by ion-implantation and photoetching. Furthermore, Japanese Patent Publication No. 60-246627, published Apr. 23, 1986 discloses a method of ion-implantation of a plasma CVD (chemical vapor deposition) produced diamond film with boron (B) and antimony (Sb) to produce P or N-type semiconductors, respectively.

U.S. Pat. No. 4,740,263 issued to Imai et al. in 1988 describes a process for preparing a diamond thin film by electron assisted chemical vapor deposition (EACVD). A boron doped P-type diamond semiconductor is prepared by the addition of a trace amount of diborane in a mixed gas of hydrogen and a hydrocarbon. Also disclosed is a potential use of a P-type diamond film in the field of diodes, especially high-frequency rectification.

In addition, M. W. Geiss, D. D. Rathman, D. J. Ehrlich, R. A. Murphy, W. T. Lindley, "High-Temperature Point-Contact Transistors and Schottky Diodes Formed on Synthetic Boron-Doped Diamond," *IEEE Electron Device Letters*, Vol. EDL-8, No. 8, August 1987, discloses the formation of point-contact transistors on synthetic boron-doped diamond. The diamond used in formation of the point-contact transistor is a diamond single crystal produced using a high-temperature-high-pressure process. More recently, H. Shiomi, Y. Nishibayashi, N. Fujimori, "Field-Effect Transistors using Boron-Doped Diamond Epitaxial Films," *Japanese Journal of Applied Physics*, Vol. 28, No. 12, Dec. 1989, teaches the production of a planar field effect transistor device based on a diamond film. The device disclosed comprises a single crystal diamond substrate on which a single crystal epitaxial layer of boron doped diamond is deposited, thereby producing a P-type semiconductive layer. Titanium (Ti) source and drain contacts, as well as, an aluminum (Al) gate Schottky contact are deposited on the diamond film.

U.S. Pat. No. 4,571,447 issued to Prins in 1986 discloses a unit for generating electric power including a diamond or diamond like material containing a P-type semiconducting layer, an N-type semiconducting layer and a P-N junction.

Current large area thin film transistors employ an amorphous silicon active layer, which results in limited electric field mobility. Typically the electric field mobility is less than 1.0 centimeter$^2$.Volt$^{-1}$.second$^{-1}$ ($cm^2$/V·sec). This results in the current driving power and frequency response of the transistors being small. Therefore, when an amorphous silicon thin film transistor is employed as a switching element for the display electrode of an active type liquid crystal display, for example, its operating speed is comparatively low.

Table 1 compares typical electron mobility levels for the three states of silicon and the single crystal state of diamond.

TABLE 1

|  | SILICON | DIAMOND |
| --- | --- | --- |
| Single Crystal | 1200–1900* | 1000–4000* |
| Polycrystalline | 20–40 | — |
| Amorphous, Hydrogenated | 0.1–1.0 | — |

*Electron Saturation (max.) Velocity Silicon Single Crystal 1 × 10$^7$ cm/sec
Diamond Single Crystal 2.4 × 10$^7$ cm/sec The use of a polycrystalline diamond thin film as the semiconductive layer in a large area thin film transistor application will, by applying a reasonable interpolation of the data in Table 1, enable carrier mobilities within the polycrystalline diamond layer on an order of 20 times greater than current amorphous silicon technology. This interpolation is considered to be reasonable due to the isoelectronic nature of silicon and carbon.

In accordance with the present invention, there is provided a thin film field-effect transistor of the type having a gate electrode electrically isolated from a source electrode and a drain electrode. The improvement includes an electrically insulating layer having the gate electrode formed on one surface thereof. A semiconducting layer has a charge carrier mobility of at least 1 $cm^2$/V.sec. The semiconducting layer has the source electrode and the drain electrode formed on one surface thereof. The other surface of the semiconducting layer is in integral contact with the other surface of the electrically insulating layer.

Other aspects of the present invention will become apparent as the following description proceeds and upon reference to the drawings, in which.

While the present invention will hereinafter be described in connection with preferred embodiments, it will be understood that it is not intended to limit the invention to these embodiments. On the contrary, it is intended to cover all alternatives, modifications, and equivalents, as may be included within the spirit and scope of the invention as defined by the appended claims.

Figure 1:
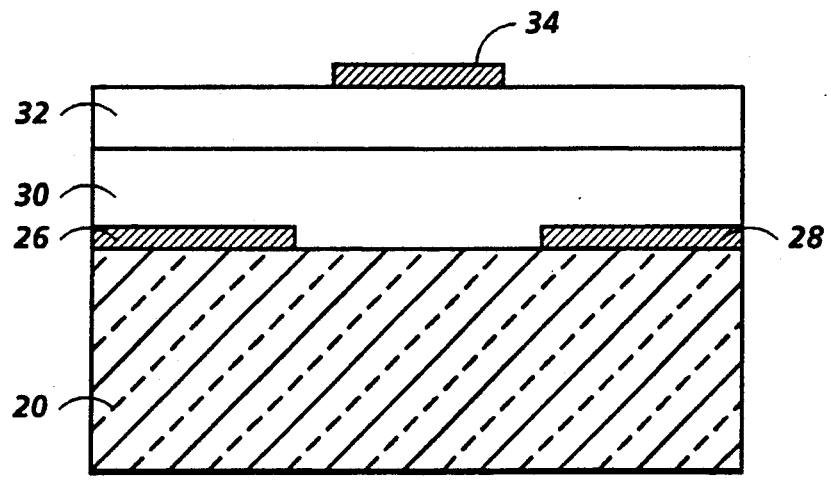
FIG. 1 is a sectional view illustrating one embodiment of a thin film transistor of the present invention.

FIG. 1 illustrates one embodiment of a thin film metal insulator semiconductor field effect transistor (MISFET) of the present invention in a staggered configuration. As shown, a transparent insulating substrate 20 of glass or similar material has the conductive source and drain electrodes, 26 and 28 respectively, deposited on one surface thereof. Active layer 30 overlaps and is interposed between source and drain electrodes 26 and 28. A gate insulating film 32 of $SiN_x$ or $SiO_2$ is formed over active layer 30, and a metallic gate electrode 34 is formed on gate insulating layer 32. Active layer 30 is formed of polycrystalline diamond, possibly doped with a group III element such as boron (B) or an interstitial monovalent atom such as lithium (Li). The gate insulating film 32 and the metallic gate electrode 34 are deposited one after the other on active layer 30 in a conventional manner. Since the optical energy gap of the active layer 30 is large, the thin film transistor is free from the influence of visible light incident upon active layer 30. With an optical energy gap of approximately 5.7 eV, there is no significant photosensitivity to visible light.

Figure 2:
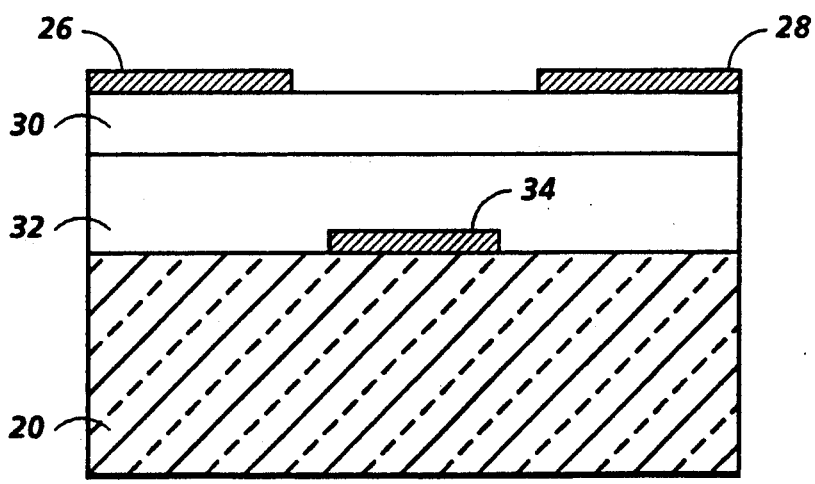
FIG. 2 is a sectional view illustrating another embodiment of the present invention.

Referring now to FIG. 2, there is shown another embodiment of a thin film metal insulator semiconductor field effect transistor (MISFET) of the present invention in an inverted staggered configuration. As shown in FIG. 2, metallic gate electrode 34 is deposited on one surface of insulating substrate 20. A gate insulating film 32 is formed over active layer 30 and gate electrode 34. Active layer 30 is formed over gate insulating film 32. Conductive source and drain electrodes 26 and 28 are spaced from one another and deposited on the outer surface of active layer 30.

Active layer 30 is made from a polycrystalline diamond film formed by using a chemical vapor deposition (CVD) process which relies on the thermal dissociation of a hydrocarbon gas, such as methane ($CH_4$) gas, in the presence of hydrogen and oxygen. A hot filament, microwave source, or flame is used to drive the dissociation process, causing deposition of the diamond film. Nucleation of the diamond crystals is initiated and controlled by the disbursement of nucleation causing particles on the surface to be coated by the film, thereby providing a method for patterning of the polycrystalline diamond deposits. Recent advances have lead to highly reliable production techniques to control the nucleation, deposition, and properties of polycrystalline diamond films thereby improving adhesion to, and broadening the range of, available substrate material. These production methods, as well as, methods of etching/patterning the films in a manner consistent with current thin film transistor production are taught by U.S. Pat. No. 4,925,701 issued to Jansen et al. in 1990, the relevant portions thereof being hereby incorporated by reference into the present application.

Figure 3:
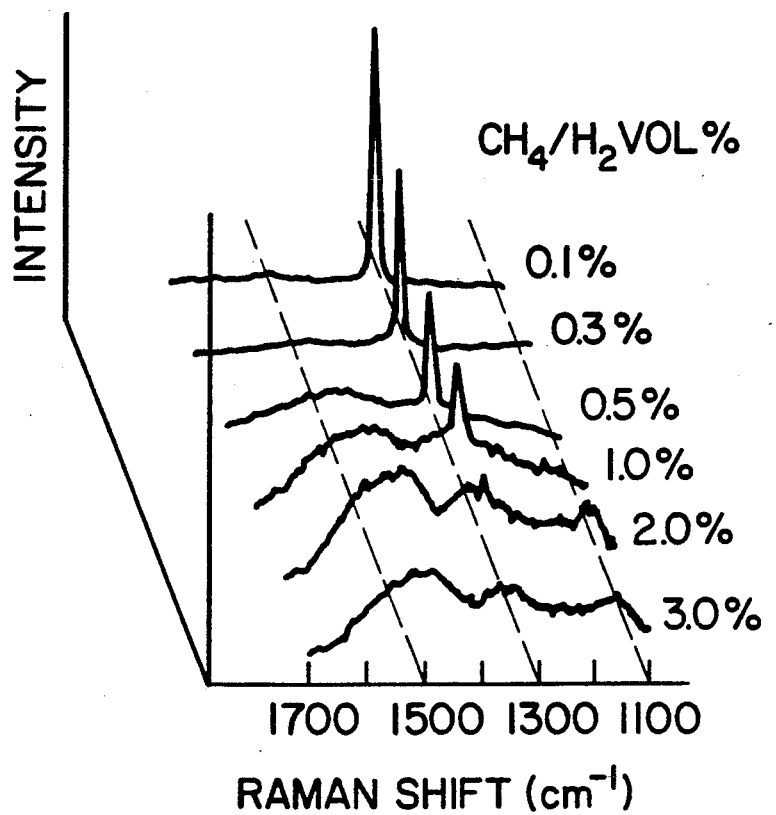
FIG. 3 is a representative illustration of the Raman spectrographs of diamond films produced at differing methane/hydrogen gas ratios.

The process used to produce the polycrystalline diamond film was optimized using a mixture of methane, hydrogen and oxygen gases. For purposes of clarification, optimized is hereinafter intended to represent the maximization of the tetrahedral, or diamond, bonding, while minimizing the trigonal, or graphitic, bonding within the polycrystalline film, thereby maximizing the resistivity of the film. The relative proportions of both diamond and graphitic bonding can be determined by analyzing the relative height of Raman spectrographic peaks produced by characterization of the polycrystalline films. FIG. 3, as illustrated by A. Ono, T. Baba, H. Funamoto, A. Nishikawa, "Thermal Conductivity of Diamond Films Synthesized by Microwave Plasma-CVD", *Japanese Journal of Applied Physics*, Vol. 25, No. 10, L 808, Oct. 1986, is an example of a series of six such Raman curves, plotted in 3-dimensional fashion to illustrate the intensity of the graphitic and diamond peaks for six different methane/hydrogen gas ratios. The presence of graphitic bonding is indicated by a peak at approximately 1550 $cm^{-1}$, while the diamond bonding is indicated by a peak at approximately 1332 $cm^{-1}$. As indicated by the results of FIG. 3, the diamond peak is maximized at a methane/hydrogen gas ratio of approximately 0.1 Vol. %. As practiced, the desired methane/hydrogen gas ratio is produced using a methane gas flow rate of 0.1–4.0 sccm in conjunction with a hydrogen gas flow rate of 100 sccm.

Figure 4:
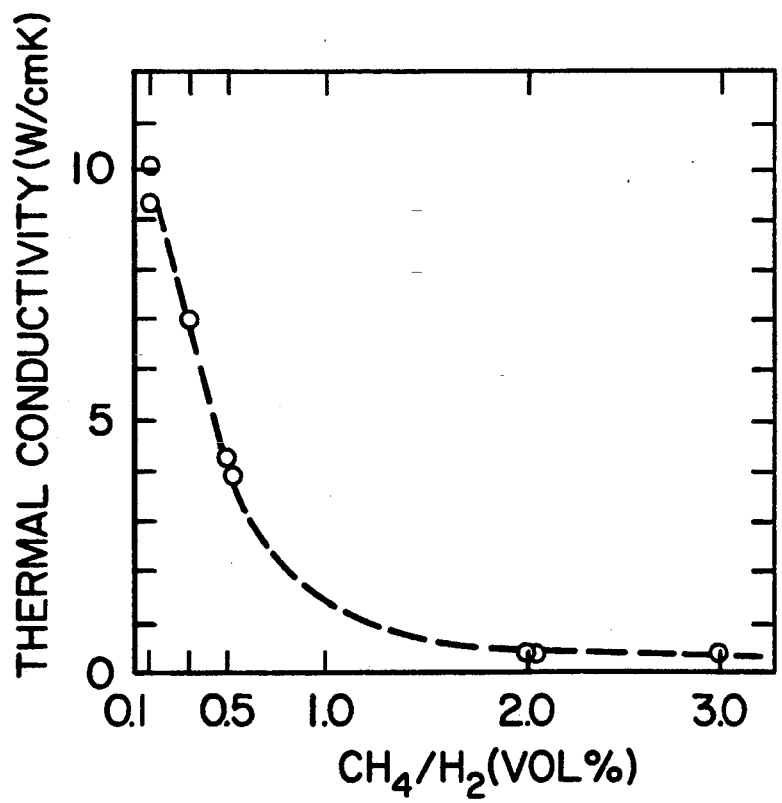
FIG. 4 is a graphical representation of the thermal conductivity of the diamond films produced with the same gas ratios of FIG. 3.

FIG. 4, from A. Ono, T. Baba, H. Funamoto, A. Nishikawa, ibid., which illustrates the thermal conductivity of a number of diamond thin films prepared at various methane/hydrogen gas ratios, indicates the increase in the thermal conductivity of the film when lower methane/hydrogen gas ratios are used. These results further support the data illustrated in FIG. 3, in that the thermal conductivity approaches the known thermal conductivity of single crystal diamond, 20 W/cm.K. Furthermore, with the thermal conductivity of the diamond film exceeding 3 W/cmK, comparable to copper and silver, the ability of the diamond to dissipate heat will enable operation of the transistor elements at temperatures higher than those possible with currently available technology.

Figure 5:
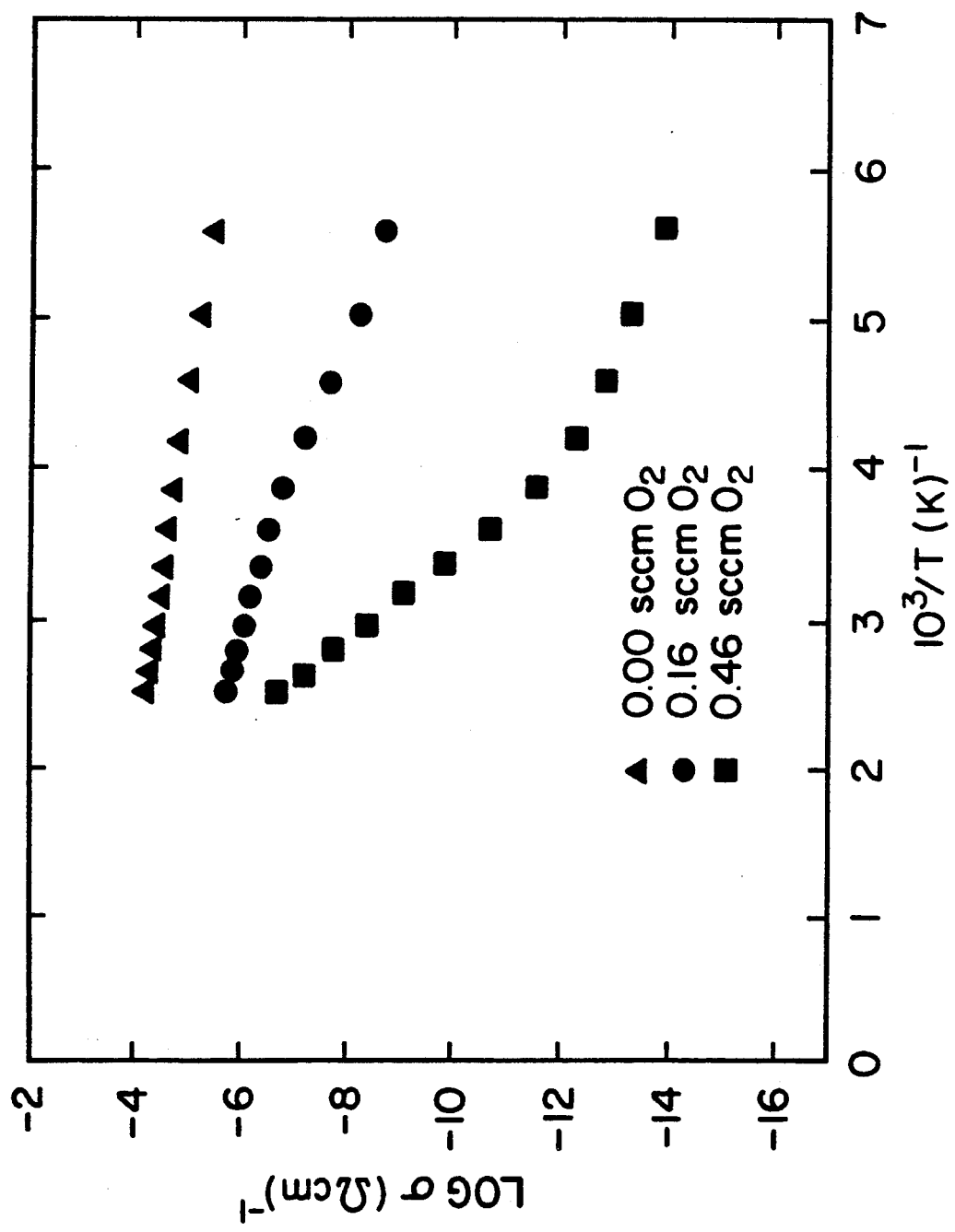
FIG. 5 is a graphical representation of the impact of oxygen gas introduced during diamond film deposition on the electrical conductivity of the diamond film.
Figure 6:
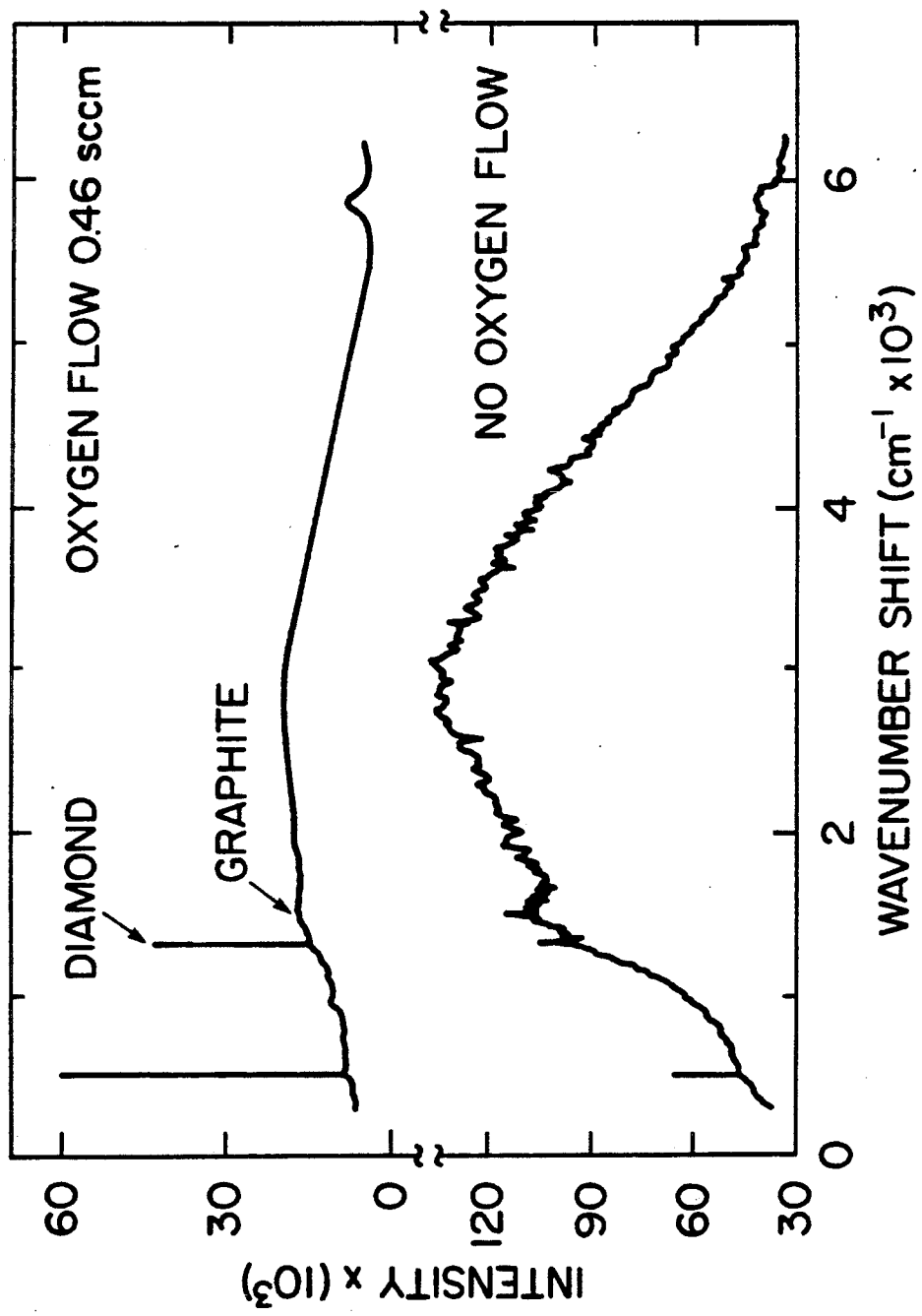
FIG. 6 is a representative illustration of the Raman spectrographs of diamond films produced with different oxygen gas flow rates.

The rate of introduction of oxygen gas into the CVD process chamber must also be closely controlled in order to optimize the diamond thin film. FIGS. 5 and 6 indicate the impact of oxygen gas on the relative proportion of diamond-graphitic bonding within the thin film. As illustrated in FIG. 5, which shows the electrical conductivity of diamond films as a function of temperature, the electrically insulating property of diamond is maximized, for a range of temperatures, when oxygen is introduced to the process at a rate of approximately 0.46 sccm.

FIG. 6, which illustrates the comparative Raman spectrographic responses of two diamond films, indicates the importance of the introduction of oxygen to the CVD process. The upper curve of FIG. 6 represents the characterization of a film produced with an oxygen flow rate of 0.46 sccm, while the lower curve characterizes a film produced in the absence of oxygen in the CVD process. The relative proportions of the diamond versus the graphitic bonding peaks provide evidence of the predominance of tetrahedral, or diamond, bonding when the film is produced in the presence of oxygen. Production of acceptable diamond thin films has been achieved using oxygen flow rates in the range of 0.1–1.0 sccm, optimization of the flow rate is therefore, also dependent upon the methane/hydrogen gas ratio in conjunction with other process parameters.

Figure 7:
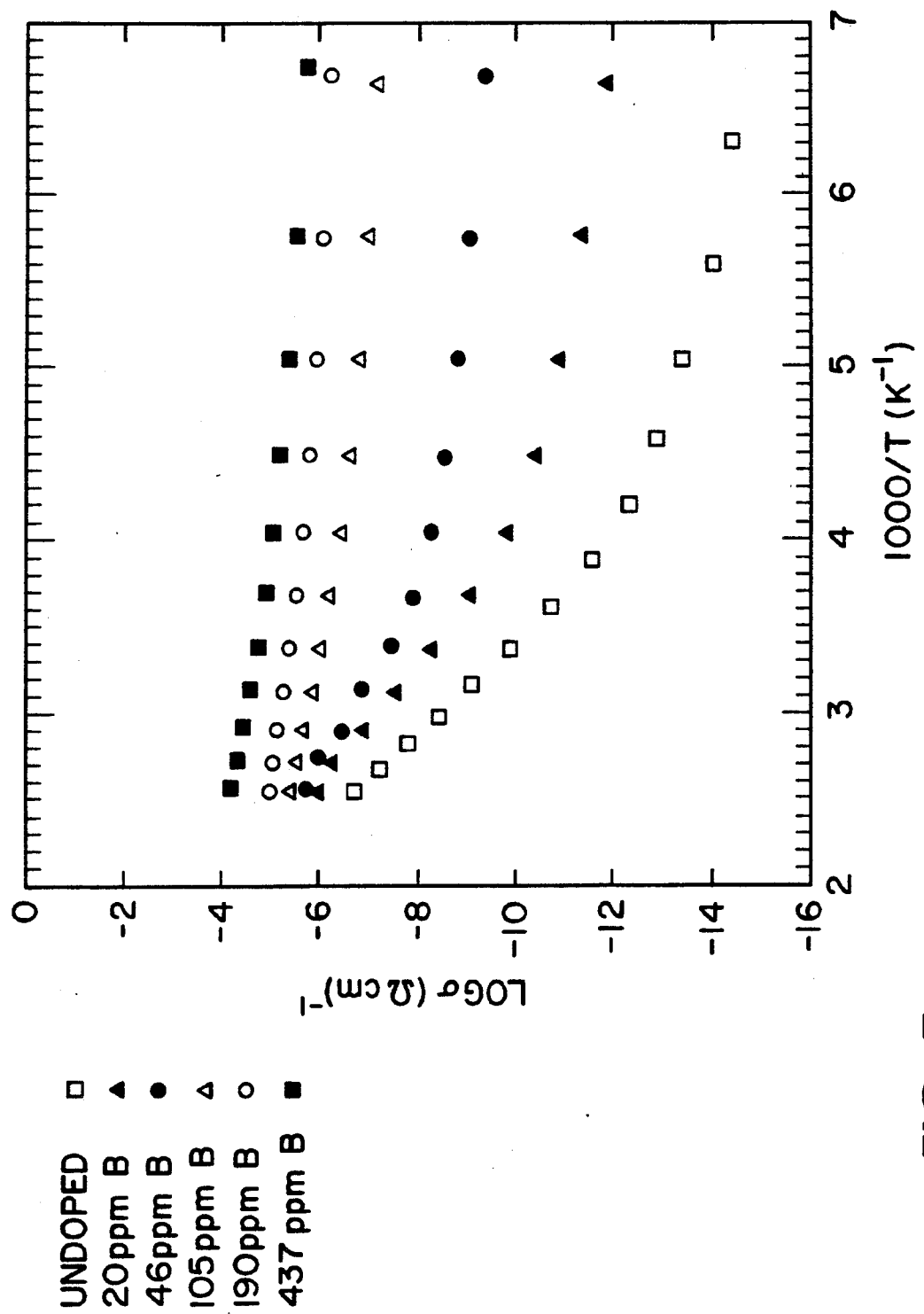
FIG. 7 is a graphical representation of the impact of boron doping on the electrical conductivity of the diamond film.

It has also been experimentally established that the room temperature resistivity of polycrystalline diamond thin films is a strong function of the substrate temperature and exhibits a maximum at about 500°-800° C. This is consistent with the observation that the graphitic bonding in the film goes through a minimum in the same temperature range and the separate determination, from FIGS. 6 and 7, that the resistivity of the films correlates inversely with the graphitic content. The preferred temperature range for the fabrication of polycrystalline diamond MISFET transistors is therefore within this range, with optimization of the film at about 650°-750° C.

The introduction of a gaseous precursor, such as diborane ($C_2H_6$) for boron doping, enables doping of the diamond film during the CVD process. FIG. 8 illustrates the relative importance of boron doping to the resistivity of the diamond film as a function of operating temperature. In the undoped condition, the polycrystalline diamond film is observed to consistently exhibit a higher resistivity than that achievable by the intentional doping of the films with varying levels of boron. From FIG. 8, it is apparent that the effective resistivity, and hence functionality of the polycrystalline diamond film as a field effect semiconductive layer, are optimized at low dopant or undoped concentrations of boron. Boron, however, is not the only possible dopant and as an alternative method, a monovalent dopant, such as lithium, may be introduced interstitially by a vapor diffusion or an ion implantation process. It should be noted however, that the introduction of dopants is not intended to increase the conductivity of the film, but rather to counterbalance the effects caused by the presence of unintentional dopants within the polycrystalline diamond films. In other words, intentional dopants, those introduced intentionally during the preparation of the thin film transistor, may be necessary to reduce the effects of the unintentional dopants that exist within the polycrystalline diamond film as produced. For this reason, the intentional dopant level will be optimally very small, or ideally non-existent, thereby rendering a polycrystalline diamond film with increased resistivity and therefore capable of exhibiting a maximum field effect response.

In recapitulation, the present invention is directed to a thin film field effect transistor made from a thin polycrystalline diamond film formed on one surface of a gate insulating film which has a gate electrode formed on the other surface thereof. Source and drain electrodes are formed on the other surface of the polycrystalline diamond film.

It is, therefore, apparent that there has been provided in accordance with the present invention, a thin film field effect transistor that fully satisfies the aims and advantages hereinbefore set forth. While this invention has been described in conjunction with various embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A thin film transistor of the type having a gate electrode electrically isolated from a source electrode and a drain electrode, wherein the improvement includes:

an electrically insulating layer having the gate electrode formed on one surface thereof, and a semiconducting layer having a charge carrier mobility of at least 1 $cm^2/V \cdot sec$, said semiconducting layer including a diamond layer said semiconducting layer having the source electrode and the drain electrode formed on one surface thereof with the other surface of said semiconducting layer being in integral contact with the other surface of said electrically insulating layer.

2. A thin film transistor according to claim 1, wherein said diamond layer has a thickness ranging from at least 0.5 $\mu$m to less than 10.0 $\mu$ms.

3. A thin film transistor according to claim 1, further including an element selected from a group consisting of group III elements for doping said diamond layer to produce a P-type semiconductive layer.

4. A thin film transistor according to claim 1, further including boron for doping said diamond layer to produce a P-type semiconductive layer.

5. A thin film transistor according to claim 1, further including an element having a monovalent atom for interstitially doping said diamond layer to produce an N-type semiconducting layer.

6. A thin film transistor according to claim 1, further including lithium for interstitially doping said diamond layer to produce an N-type semiconducting layer.

7. A thin film transistor according to claim 1, wherein said electrically insulating layer includes $SiO_2$ (silicon dioxide).

8. A thin film transistor according to claim 1, wherein said electrically insulating layer includes SiN (silicon nitride).

9. A thin film transistor according to claim 1, wherein:

said polycrystalline diamond layer has a thickness of about 1.0 $\mu$m; and said electrically insulating layer has a thickness of about 1.0 $\mu$m.

10. A thin film transistor according to claim 1, further including a heat resistant, inorganic substrate having a planar surface in integral contact with the surface of said semiconducting layer having the source electrode and the drain electrode formed thereon.

11. A thin film transistor according to claim 1, further including a heat resistant, inorganic substrate having a planar surface in integral contact with the surface of said insulating layer having the gate electrode formed thereon.

* * * * *

UNITED STATES PATENT AND TRADEMARK OFFICE
CERTIFICATE OF CORRECTION

PATENT NO.   : 5,099,296
DATED        : March 24, 1992
INVENTOR(S)  : Joseph Mort et al.

It is certified that error appears in the above--identified patent and that said Letters Patent is hereby corrected as shown below:

Col. 6, line 13, after "a" insert --polycrystalline --.

Signed and Sealed this

Twenty-seventh Day of December, 1994

Attest:

BRUCE LEHMAN

Attesting Officer     Commissioner of Patents and Trademarks